CHOPPER CIRCUIT CAPABLE OF HANDLING LARGE BIPOLARITY SIGNALS

Filed May 13, 1966

INVENTORS
Thor B. Bergersen
James F. Kane
Dustin E. Morris
Mueller, Aichele & Rauner
ATTY'S.

United States Patent Office 3,408,511

Patented Oct. 29, 1968

3,408,511

CHOPPER CIRCUIT CAPABLE OF HANDLING LARGE BIPOLARITY SIGNALS

Thor B. Bergersen, Scottsdale, James F. Kane, Phoenix, and Dustin E. Morris, Tempe, Ariz., assignors to Motorola, Inc., Franklin Park, Ill., a corporation of Illinois Filed May 13, 1966, Ser. No. 549,942

7 Claims. (Cl. 307—237)

ABSTRACT OF THE DISCLOSURE

A field-effect transistor switching circuit including voltage limiting means connected between an FET substrate and one of the source and drain regions thereof. The voltage limiting means includes a diode which prevents the FET PN junctions from becoming forward biased by large bipolarity input signals.

This invention relates to an improved insulated-gate field-effect transistor (IGFET) circuit having large bipolarity voltage capabilities. This circuit is operative as an active component of an electronic chopper or an electronic analog switching circuit and is adapted to receive large bipolarity analog input signal voltages.

When an insulated-gate field-effect transistor is used in analog switching or chopper circuits, it must be voltage controlled in such a manner that the P-N junctions between semiconductor substrate and source regions and between semiconductor substrate and drain regions do not become forward biased and enable current to flow from either the substrate region to the source region or from the substrate region to the drain region, respectively. This requirement means that the insulated-gate field-effect transistor can only handle input signals of a limited amplitude if these signals are connected directly in parallel with either of the above defined P-N junctions and between one of the source or drain regions and the substrate region, which is usually at ground potential. If, using the above-described connection, the input signals applied across either of the P-N junctions would be at a voltage level sufficiently high to forward bias these P-N junctions into conduction, then an alternative input signal connection must be resorted to. One such alternative connection involves disconnecting the substrate region from its ground return and from the source of input signals, leaving the substrate region floating. This mode of IGFET operation will prevent the P-N junctions between substrate and source regions and between substrate and drain regions from becoming forward biased, but it will also subject the substrate region to extraneous noise pickup and this is obviously an undesirable compromise for enabling the insulated-gate field-effect transistor to handle large bipolarity signals connected between either source or drain and substrate regions.

Accordingly, it is an object of this invention to provide a new and improved insulated-gate field-effect transistor circuit operative to process large bipolarity input signal voltages at a minimum noise level.

Another object of this invention is to provide a new and improved insulated-gate field-effect transistor circuit capable of handling large bipolarity input signal voltage levels between either source or drain and substrate regions.

Another object of this invention is to provide an insulated-gate field-effect transistor circuit which is particularly adapted to operate as an active element in electronic chopper or analog switching circuits.

A feature of this invention is the provision of an insulated-gate field-effect transistor circuit including adjacent source, substrate and drain regions with a P-N junction between the substrate and source regions and a P-N junction between the substrate and drain regions. A voltage limiting circuit is connected to the substrate region and includes a diode which is connected between the substrate region and either the source or the drain region. This diode becomes conductive for large amplitude signals of one polarity which are applied to one of the source or drain regions and thereby protects one of the above-identified P-N junctions from becoming forward biased. When large amplitude input signals of an opposite polarity are applied to the same source or drain region, this diode becomes reverse biased and prevents the input signals from reaching the other of the two P-N junctions, and forward biasing this junction.

These and other objects and features of the invention will become more fully apparent in the following description of the accompanying drawing wherein.

Briefly described, this invention includes an insulated-gate field-effect transistor having source, substrate and drain semiconductor regions, with the substrate region being of one conductivity semiconductor material and the source and drain regions being of an opposite conductivity semiconductor material. The substrate and source regions have a first P-N junction therebetween and the substrate and drain regions have a second P-N junction therebetween. A voltage limiting circuit is connected to the substrate region of the insulated-gate field-effect transistor, and this circuit includes a diode which may be connected between the substrate region and either the source or the drain region for preventing both the first and the second P-N junctions from becoming forward biased into conduction when bipolarity input signals above a predetermined voltage level are applied to one of the source and drain regions. This diode is conductive for large signals of one polarity and provides a blocking action for large signals of an opposite polarity and insures that neither the first nor the second P-N junction is forward biased during the operation of the insulated-gate field-effect transistor circuit which will be described in further detail below.

Figure 1:
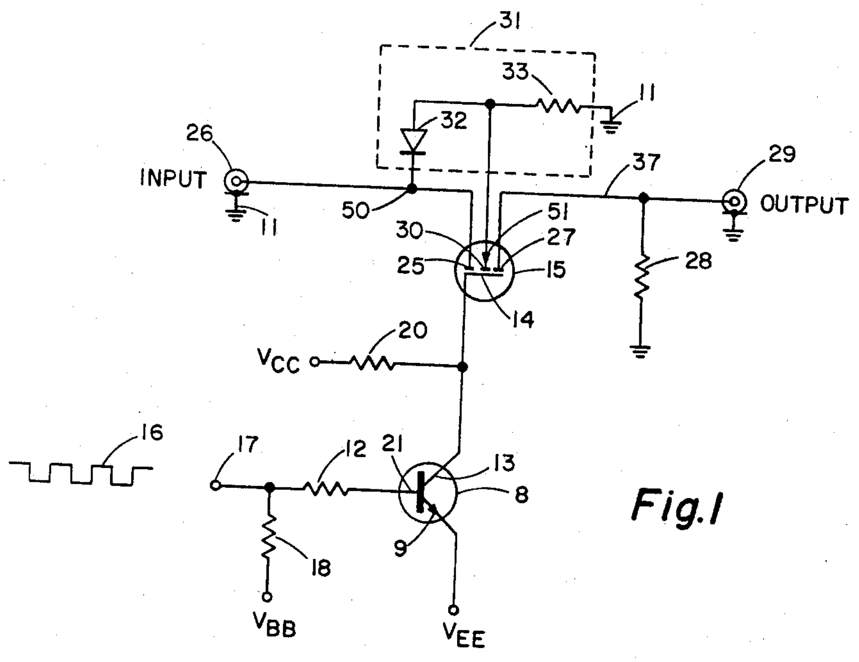
FIG. 1 is a schematic diagram of an electronic chopper circuit incorporating the novel, insulated-gate field-effect transistor circuit according to this invention.

Referring to FIG. 1 of the drawing, there is shown a transistorized chopper circuit of which the voltage limiting field-effect transistor circuit of the invention is an integral part. The chopper circuit of FIG. 1 includes a standard NPN switching transistor 8 connected at the emitter electrode 9 thereof to an emitter supply voltage $V_{EE}$ and connected at the base electrode 21 thereof to a current limiting resistor 12. The collector electrode 13 of switching transistor 8 is connected to the gate electrode 14 of an insulated-gate field-effect transistor 15. A source (not shown) of control signals 16 is connectable to an input terminal 17 in the base-emitter circuit of transistor 8, and a base bias resistor 18 is connected between the input terminal 17 and a source of base biasing potential $V_{BB}$.

When the base electrode 21 of transistor 8 is biased positive with respect to the emitter electrode 9, transistor 8 will conduct and cause current to flow in the collector load resistor 20, thereby varying the potential on the gate electrode 14 of the insulated-gate fiield-effect transistor 15. This potential is varied by the control voltage 16 applied to transistor 8, and the application of a positive voltage to gate electrode 14 causes a redistribution of minority carriers in the substrate region between the source and drain regions and results in the formation of an induced conductive channel between source and drain. Thus, the input signal at 26 may be chopped or otherwise modulated in accordance with the positive voltage level at gate electrode 14.

Figure 2:
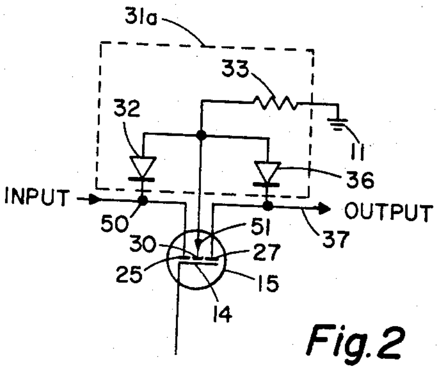
FIG. 2 is a modification of the insulated-gate field-effect transistor circuit of FIG. 1.
Figure 3:
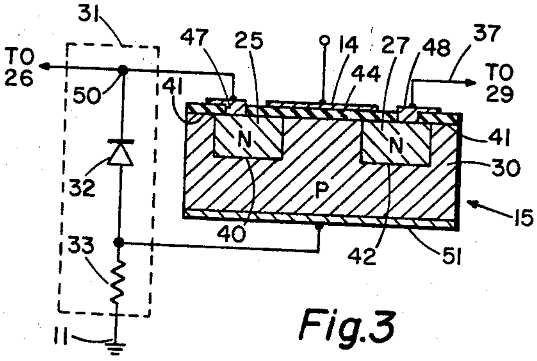
FIG. 3 is a cross-sectional view of an enhancement mode insulated-gate field-effect transistor device and its associated voltage limiting circuitry which together form the novel IGFET circuit according to this invention.

Referring to FIGS. 1–3, the fiield-effect transistor 15 includes a source region 25 which is connected to a source 26 of input signals and a drain region 27 which is connected to an output load resistor 28 and to further output signal ultilization means 29. The substrate region of the field-effect transistor 15 is referenced at 30 in FIGS. 1–3 and this substrate material is connected via contact 51 to a voltage limiting circuit means. This network 31 includes a diode 32 which is connected between the substrate 30 and source region 25 and a current limiting resistor 33 which is connected between substrate region 30 and a point of reference potential 11.

The voltage limiting circuit means 31 in FIGS. 1 and 3 is used to prevent large bipolarity signals at the source region 25 of transistor 15 from forward biasing the substrate-to-source and substrate-to-drain P-N junction 40 and 42, repsectively. However, this circuit means may be modified to include a second diode 36 as shown in the voltage limiting circuit configuration 31*a* in FIG. 2 if large bipolarity signals are likely to appear at both the source and drain regions of the transistor 15. Extraneous noise picked up by conductor 37 or possible feedback from the output 29 may caues large bipolarity signals to appear between the drain region 27 and substrate 30 of field-effect transistor 15. These signals may cause one or both of the P-N junctions 40 and 42 in the field-effect transistor 15 to become forward biased into conduction in the absence of a second diode 36 to perform a function identical to that of diode 32. Thus, using the voltage limiting arrangement in the circuit of FIG. 2, either the source or the drain region of transistor 15 may be connected to receive large amplitude input signals with the assurance that neither the substrate-to-source nor the substrate-to-drain P-N junction will be forward biased into conduction.

In order to more clearly understand the exact nature of the voltage limiting feature according to this invention, reference should be made to FIG. 3 which illustrates a cross-sectional view of a typical insulated-gate field-effect transistor and wherein like reference numerals denote corresponding elements in the several figures. In FIG. 3, the P-type conductivity substrate region 30 is adjacent to and underlies the N-type source and drain regions 25 and 27, respectively. A first P-N junction 40 between the P-type substrate region 30 and the N-type source region 25 extends to a surface 41 of the transistor 15 structure, and a second P-N junction 42 between substrate region 30 and drain region 27 also extends to surface 41 of the transistor structure.

The source and drain regions 25 and 27 of the insulated-gate field-effect transistor 15 may be diffused into the P-type substrate region 30 by presently known integrated circuit construction techniques. In one type of insulated-gate field-effect transistor presently available, the N-type source and drain regions are of low resistivity semiconductor material and the P-type substrate material is a high resistivity material.

An oxide layer 44 is grown on the surface 41 of the semiconductor device to provide the necessary passivation for the P-N junctions 40 and 42 at the surface 41 and to provide a dielectric layer between semiconductor surface 41 and the gate 14. The metal area of the gate 15 in conjunction with the insulating oxide layer 44 and the substrate region 30 form a capacitor, with the metal area of the gate 14 serving as a top plate and the substrate 30 serving as the bottom plate. Thus, the potential on the gate 14 controls the resistance of the substrate region between source and drain regions and the mobility of charge carriers therein moving either from the source-to-drain or from the drain-to-source regions, depending upon how the transistor device 15 is connected with respect to the incoming signals.

Portions of the insulating oxide layer 44 have been etched away to enable electrical contacts to be made via metallization areas 47 and 48 at the surface of the N-type source and drain regions 25 and 27, respectively. This etching process is carried out using well known integrated circuit construction techniques.

The substrate region 30 and the source and drain regions 25 and 27 are analogous to two spatially separated diodes connected back to back. Since the source and drain regions 25 and 27 are isolated by the substrate region 30, any drain to source current or source to drain current in the absence of a gate voltage is extremely low. The P-N junctions 40 and 42 of the so-called back to back diodes defined above must not be allowed to become forward biased for any amount of channel conduction since this would cause extraneous currents to flow to the input and output circuits of a practical chopping or switching device such as the circuit shown in FIG. 1.

The voltage limiting circuit means 31 in FIGS. 1 and 3 is provided in accordance with the teachings of this invention to insure that neither the first P-N junction 40 nor the second P-N junction 42 in the field-effect transistor 15 will become forward biased for large signal operation. The protection diode 32 in the voltage limiting circuit means 31 is connected directly in parallel with the adjacent P and N regions 30 and 25 and has a forward voltage drop which is less than that of the "diodes" formed by the adjacent semiconductor P-N regions 30 and 25 and the P-N regions 30 and 27 separated by junctions 40 and 42, respectively. The forward voltage drops of protection diode 32 is typically in order of 0.4 volt whereas the offset voltage between regions 30 and 25 and regions 30 and 27 may be as high as 0.8 volt. Thus, a large negative input signal applied between point 50 and ground potential and exceeding a predetermined negative voltage will cause current to flow throuh resistor 33 and diode 32 back to source 26. However, if the current limiting resistor 33 is made very large, this current can be held to a very low and substantially constant value.

If the voltage at point 50 swings in a positive direction, the diode 32 will block the path between point 50 and the substrate metallization 51 and prevent the diode formed by substrate region 30 and drain region 27 from becoming forward biased and drawing current. If the diode 32 is omitted in circuit means 31 and the substrate metallization 51 is connected directly to the source 26, then the current will flow across the second P–N junction 42 during large positive voltage swings.

Using the voltage limiting circuit means 31 in accordance with the teachings of this invention, both first and second P–N junctions 40 and 42, respectively, can be protected against the forward bias caused by large bipolarity signals between point 50 and ground potential without leaving the substrate region 30 floating and subjected to extraneous noise signals. As described above, a second diode 36 (FIG. 2) may be connected between the drain contact 48 and the substrate metallization 51 in order to protect the P–N junctions 40 and 42 from being forward biased into conduction by large bipolarity signals on conductor 37.

We claim:

1. A field-effect transistor circuit capable of handling large bipolarity input signals including, in combination:

(a) an insulated-gate field-effect transistor having source, substrate and drain semiconductor regions with said substrate region being of one conductivity semiconductor material and said source and drain regions being of an opposite conductivity semiconductor material, a first P–N junction between said substrate and source regions, a second P–N junction between said substrate and drain regions, and (b) voltage limiting means connected to said substrate region and including a diode connected between said substrate region and one of said source and drain regions, said diode shunting one of said first and second P–N junctions and preventing said first and second P–N junctions from becoming forward biased into conduction when bipolarity input signals above a predetermined voltage level are applied to said one of said source and drain regions.

2. The circuit according to claim 1 wherein said voltage limiting means includes impedance means connected between said substrate region and a point of reference potential, said impedance means providing a conductive path from said diode to said point of reference potential when an input signal appearing between said one of said source and drain regions and said point of reference potential exceeds said predetermined voltage level.

3. The circuit according to claim 2 wherein said diode has a forward voltage drop which is lower than the offset voltages of said substrate and source regions and of said substrate and drain regions which are separated respectively by said first and second P–N junctions of said insulated-gate field-effect transistor.

4. The circuit according to claim 3 wherein said insulated-gate field-effect transistor includes a gate electrode to which is connected a source of chopping signals for controlling the mobility of charge carriers in an induced channel of said substrate region between said source and drain regions.

5. In a field-effect transistor circuit including an insulated-gate field-effect transistor having a semiconductor substrate region of one conductivity semiconductor material and having source and drain semiconductor regions adjacent thereto and of an opposite conductivity semiconductor material, said substrate region separated from said source region by a first P–N junction and separated from said drain regions by a second P–N junction, and a gate electrode connectable to a source of switching signals and insulated from said substrate region and from said source and drain, the improvement comprising a voltage limiting means connected to said substrate region and including a diode connected between said substrate region and one of said source and drain regions of said insulated-gate field-effect transistor, said diode shunting one of said first and second P–N junctions and having a forward voltage drop which is lower than the voltage offset across either said first or said second P–N junctions and thereby preventing either of said first or said second P–N junctions from becoming forward biased into conduction when bipolarity input signals applied to one of said source and drain regions exceed a predetermined level.

6. The circuit according to claim 5 wherein said voltage limiting means includes impedance means connected between said substrate region and a point of reference potential, said impedance means providing a current path from said diode to said point of reference potential when input signals connected between one of said source and drain regions and said point of reference potential exceeds said predetermined voltage level, said diode becoming conductive for signals of one polarity exceeding said predetermined voltage level and thereby providing an effective bypass around one of said first and second P–N junctions and said diode preventing signals of an opposite polarity from forward biasing the other of said first and second junctions into conduction.

7. The circuit according to claim 6 wherein:

(a) said diode is connected between said source region and said substrate region for preventing large bipolarity input signals appearing between said source region and said point of reference potential from forward biasing either of said first or second P–N junctions, said circuit further including, (b) another diode connected between said substrate region and said drain region for preventing large bipolarity signals appearing between said drain region and said point of reference potential from forward biasing either said first or second P–N junctions of said insulated-gate field-effect transistor.

References Cited

UNITED STATES PATENTS 3,246,173 4/1966 Silver -------------- 317—235

JOHN W. HUCKERT, *Primary Examiner.*

J. D. CRAIG, *Assistant Examiner.*